United States Patent
Oliaei

(10) Patent No.: US 8,711,980 B2
(45) Date of Patent: Apr. 29, 2014

(54) RECEIVER WITH FEEDBACK CONTINUOUS-TIME DELTA-SIGMA MODULATOR WITH CURRENT-MODE INPUT

(75) Inventor: Omid Oliaei, Tempe, AZ (US)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 12/879,477

(22) Filed: Sep. 10, 2010

(65) Prior Publication Data
US 2012/0063519 A1 Mar. 15, 2012

(51) Int. Cl.
*H03K 9/00* (2006.01)

(52) U.S. Cl.
USPC ............ 375/316; 341/126; 341/155; 341/77; 341/110; 341/144

(58) Field of Classification Search
USPC ............ 375/316, 252; 341/126, 144, 155, 77, 341/110
See application file for complete search history.

(56) References Cited

U.S. PATENT DOCUMENTS

| | | | |
|---|---|---|---|
| 6,584,157 B1* | 6/2003 | Van Der Zwan et al. | 375/247 |
| 6,600,789 B1* | 7/2003 | Lipasti et al. | 375/247 |
| 7,983,640 B2* | 7/2011 | Doerrer | 455/230 |
| 2004/0145504 A1 | 7/2004 | Doerrer et al. | 341/143 |
| 2006/0103560 A1* | 5/2006 | Nagai | 341/143 |
| 2007/0024480 A1* | 2/2007 | Schwoerer | 341/144 |
| 2007/0159262 A1* | 7/2007 | Quan et al. | 331/16 |
| 2008/0062022 A1 | 3/2008 | Melanson | 341/143 |
| 2008/0085693 A1* | 4/2008 | Harms | 455/255 |
| 2008/0143567 A1* | 6/2008 | Vadipour | 341/143 |
| 2010/0219999 A1* | 9/2010 | Oliaei et al. | 341/143 |
| 2011/0254718 A1 | 10/2011 | Matsukawa et al. | 341/143 |

FOREIGN PATENT DOCUMENTS

| | | | |
|---|---|---|---|
| KR | 10-0329673 | 8/2002 | H03G 3/30 |
| WO | WO 95/30275 | 11/1995 | H03G 3/30 |
| WO | WO 2005/031755 | 4/2005 | G11C 27/02 |
| WO | WO 2007/085997 | 8/2007 | H03M 3/00 |
| WO | WO 2008/137662 | 11/2008 | H03M 3/02 |
| WO | WO 2010/079539 | 7/2010 | H03M 3/02 |

OTHER PUBLICATIONS

European Search Report; Application No. 11180627.9; pp. 10, Dec. 5, 2011.
Kobayashi et al.; "A 1mW Delta-Sigma ADC with Fully Integrated Baseband Module for GSM application"; Solid State Circuits Conference; Proceedings of the 25th European IEEE; pp. 178-181, 1999.
Georgantas et al; "I-MODE: Low Power RF to Baseband Interface for Multi-Mode Portable Phones"; ESPRIT 25702; pp. 12, 1999.
Chen et al.; "A 0.5V 2-1 Cascaded Continous-Time Delta-Sigma Modulator Sythesized with a New Method"; Circuits and Systems; 53rd IEEE International Midwest Symposium on, IEEE; pp. 1165-1168, 2010.

(Continued)

*Primary Examiner* — Leila Malek
(74) *Attorney, Agent, or Firm* — Baker Botts LLP.

(57) ABSTRACT

In accordance with some embodiments of the present disclosure, a receiver may include a downconverter configured to demodulate a modulated wireless signal to produce a current-mode baseband signal and an analog-to-digital converter (ADC) configured to convert the current-mode baseband signal into a digital output signal. The downconverter may be coupled to the ADC without an intervening filter element.

21 Claims, 4 Drawing Sheets

(56) References Cited

OTHER PUBLICATIONS

Office Action of the Korean Intellectual Property Office, w/ English translation; Application No. 10-2011-0090175; pp. 8, Jan. 28, 2013.

European Office Action; Application No. 11 180 62739-1802; pp. 5, Mar. 5, 2013.
Office Action received for Korean Patent Application No. 1020110090175, mailed on Aug. 27, 2013, 6 pages of English Translation only.

* cited by examiner

RECEIVER WITH FEEDBACK CONTINUOUS-TIME DELTA-SIGMA MODULATOR WITH CURRENT-MODE INPUT

TECHNICAL FIELD

The present disclosure relates generally to wireless communication and, more particularly, to receivers of wireless communication devices.

BACKGROUND

Wireless communications systems are used in a variety of telecommunications systems, television, radio and other media systems, data communication networks, and other systems to convey information between remote points using wireless transmitters and wireless receivers. A transmitter is an electronic device which, usually with the aid of an antenna, propagates an electromagnetic signal such as radio, television, or other telecommunications. Transmitters often include signal amplifiers which receive a radio-frequency or other signal, amplify the signal by a predetermined gain, and communicate the amplified signal. On the other hand, a receiver is an electronic device which, also usually with the aid of an antenna, receives and processes a wireless electromagnetic signal. In certain instances, a transmitter and receiver may be combined into a single device called a transceiver.

Receivers include a number of components that are arranged to convert a received wireless signal, usually in the radio-frequency spectrum, to a digital signal capable of being processed by digital circuitry (e.g., microprocessors, digital signal processors, etc.). Selected components of a traditional receiver are shown in FIG. 5. As shown in FIG. 5, a traditional receiver 21 may include a low-noise amplifier (LNA) 34 to amplify a received radio-frequency (RF) signal. The amplified RF signal may then be frequency downconverted (i.e., demodulated) based on an oscillation signal produced by oscillator 10. The downconverted signal may then be filtered by low-pass filter 36, providing a low-pass filtered analog signal at its output. This analog signal may be converted to a digital signal by analog-to-digital converter (ADC) 24. Such digital signal may then be communicated to digital circuitry for further processing.

In such traditional receiver designs, the analog signal received by ADC 24 is in the form of a voltage. This voltage is usually converted into a current using a resistor or transconductor within ADC 24. Therefore, low-pass filter 36 must avoid any signal clipping. Low-pass filter 36 must provide sufficient filtering of undesired signals and exercise automatic gain control over a large range. Low-pass filter 36 must also satisfy a specific set of in-band characteristics such as group-delay variation and droop. All of these requirements for low-pass filter 36 render it costly, power-hungry, and complex.

In addition, analog-to-digital converters must typically satisfy blocking specifications. Blocking specifications may refer to the capability of the receiver to withstand extremely powerful signals at a frequency other than the desired signal (e.g., at a frequency of 20 KHz more or less from the frequency of the desired signal). If the input of a receiver receives such powerful undesired signals in close frequency proximity to the desired signal, the unwanted signals may cause the receiver to become insensitive to the desired signal.

Furthermore, a conventional receiver, such as that depicted in FIG. 5, radio frequency and analog blocks preceding ADC 24 may generate a direct current (DC) voltage, or slowly varying, signal known as a DC offset. In such a receiver, baseband blocks after downconverter 28 may provide a large DC gain to amplify the desired signal. The adverse effect of this large DC gain is amplification of the DC offset. This leads to a large DC voltage at the input of ADC 24 which can severely limit its dynamic range. The conventional solution to the DC offset problem includes filtering the output signal of ADC 24 a digital filter in order to measure DC offset at the input of ADC 24. The digital code generated by the digital lowpass filter is subsequently applied to a digital-to-analog converter (DAC). The DAC output is roughly equal to the DC offset and it is fed back into the ADC in order to cancel the DC offset. This DC offset cancellation (DCOC) loop requires extra hardware (digital filter and DAC) which adds to the complexity and cost of the system. Furthermore, DCOC is performed multiple times across different settings for a multimode receiver, which may lead to long calibration time.

SUMMARY

In accordance with some embodiments of the present disclosure, a receiver may include a downconverter configured to demodulate a modulated wireless signal to produce a current-mode baseband signal and an analog-to-digital converter (ADC) configured to convert the current-mode baseband signal into a digital output signal. The downconverter may be coupled to the ADC without an intervening filter element.

Technical advantages of one or more embodiments of the present disclosure may include allowing for filtering of a receiver baseband signal without the need for a filtering element between a downconverter and an analog-to-digital converter of the receiver. Elimination of such a filtering element may reduce receiver current drain, receiver power consumption, reduce physical size of a receiver, reduce tuning and automatic gain control complexity associated with traditional baseband filters, and/or other advantages.

It will be understood that the various embodiments of the present disclosure may include some, all, or none of the enumerated technical advantages. In addition, other technical advantages of the present disclosure may be readily apparent to one skilled in the art from the figures, description and claims included herein.

BRIEF DESCRIPTION OF THE DRAWINGS

For a more complete understanding of the present disclosure and its features and advantages, reference is now made to the following description, taken in conjunction with the accompanying drawings, in which.

DETAILED DESCRIPTION

Figure 1:
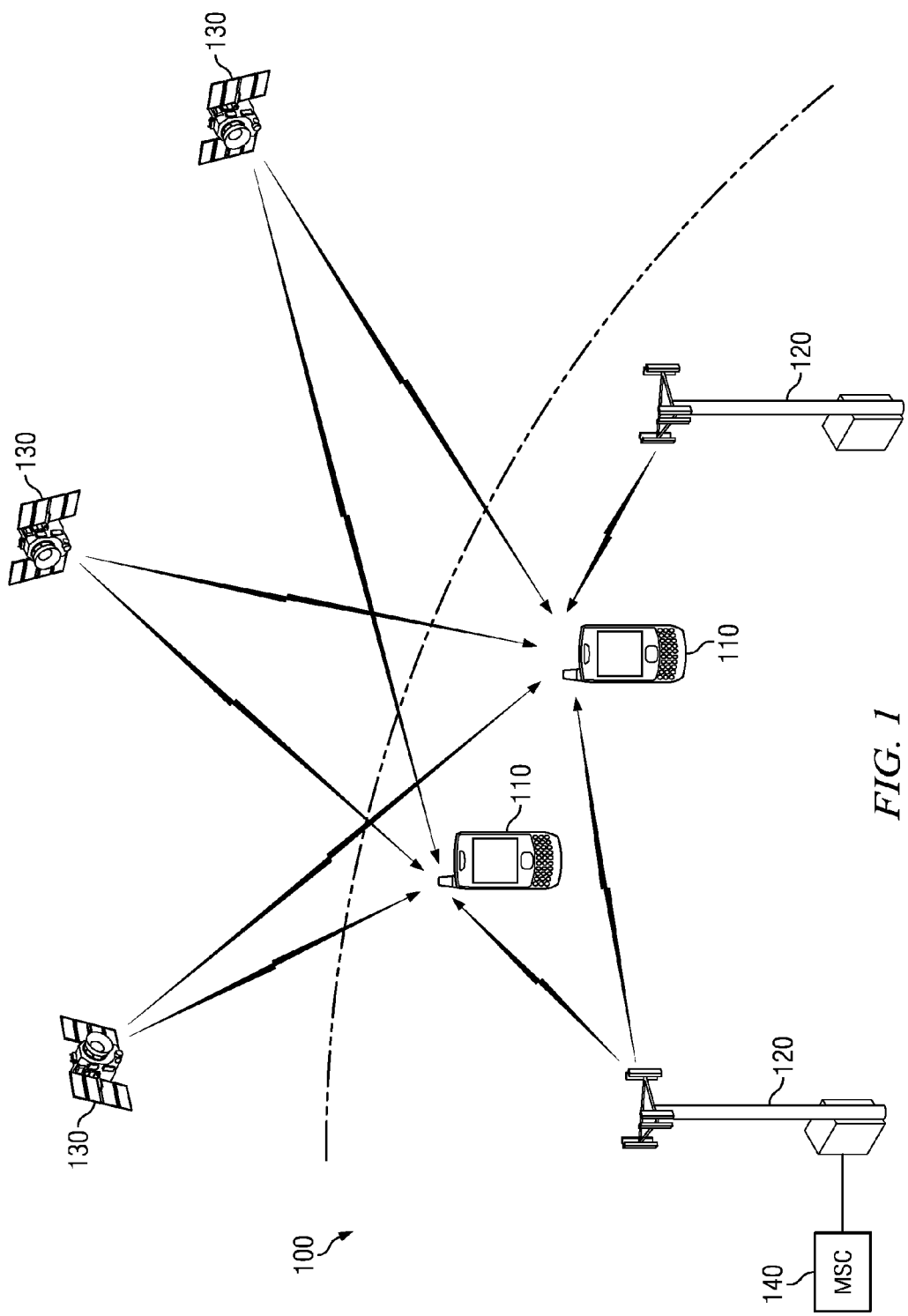
FIG. 1 illustrates a block diagram of an example wireless communication system, in accordance with certain embodiments of the present disclosure.

FIG. 1 illustrates a block diagram of an example wireless communication system 100, in accordance with certain embodiments of the present disclosure. For simplicity, only two terminals 110 and two base stations 120 are shown in FIG. 1. A terminal 110 may also be referred to as a remote station, a mobile station, an access terminal, user equipment (UE), a wireless communication device, a cellular phone, or some other terminology. A base station 120 may be a fixed station and may also be referred to as an access point, a Node B, or some other terminology. A mobile switching center (MSC) 140 may be coupled to the base stations 120 and may provide coordination and control for base stations 120.

A terminal 110 may or may not be capable of receiving signals from satellites 130. Satellites 130 may belong to a satellite positioning system such as the well-known Global Positioning System (GPS). Each GPS satellite may transmit a GPS signal encoded with information that allows GPS receivers on earth to measure the time of arrival of the GPS signal. Measurements for a sufficient number of GPS satellites may be used to accurately estimate a three-dimensional position of a GPS receiver. A terminal 110 may also be capable of receiving signals from other types of transmitting sources such as a Bluetooth transmitter, a Wireless Fidelity (Wi-Fi) transmitter, a wireless local area network (WLAN) transmitter, an IEEE 802.11 transmitter, and any other suitable transmitter.

In FIG. 1, each terminal 110 is shown as receiving signals from multiple transmitting sources simultaneously, where a transmitting source may be a base station 120 or a satellite 130. In certain embodiments, a terminal 110 may also be a transmitting source. In general, a terminal 110 may receive signals from zero, one, or multiple transmitting sources at any given moment.

System 100 may be a Code Division Multiple Access (CDMA) system, a Time Division Multiple Access (TDMA) system, or some other wireless communication system. A CDMA system may implement one or more CDMA standards such as IS-95, IS-2000 (also commonly known as "1x"), IS-856 (also commonly known as "1xEV-DO"), Wideband-CDMA (W-CDMA), and so on. A TDMA system may implement one or more TDMA standards such as Global System for Mobile Communications (GSM). The W-CDMA standard is defined by a consortium known as 3GPP, and the IS-2000 and IS-856 standards are defined by a consortium known as 3GPP2.

Figure 2:
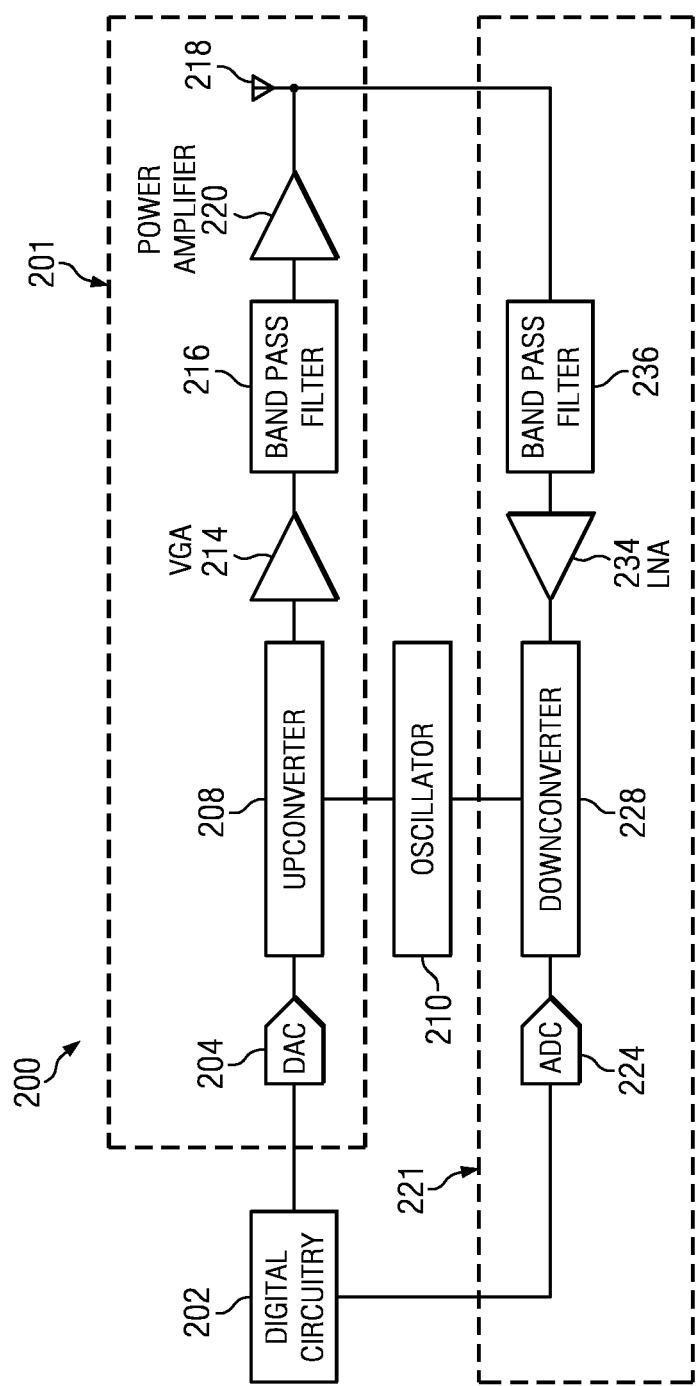
FIG. 2 illustrates a block diagram of selected components of an example transmitting and/or receiving element, in accordance with certain embodiments of the present disclosure.

FIG. 2 illustrates a block diagram of selected components of an example transmitting and/or receiving element 200 (e.g., a terminal 110, a base station 120, or a satellite 130), in accordance with certain embodiments of the present disclosure. Element 200 may include a transmit path 201 and/or a receive path 221. Depending on the functionality of element 200, element 200 may be considered a transmitter, a receiver, or a transceiver. In addition, in certain embodiments transmit path 201 may be considered a transmitter, while receiver path 221 may be considered a receiver.

As depicted in FIG. 2, element 200 may include digital circuitry 202. Digital circuitry 202 may include any system, device, or apparatus configured to process digital signals and information received via receive path 221, and/or configured to process signals and information for transmission via transmit path 201. Such digital circuitry 202 may include one or more microprocessors, digital signal processors, and/or other suitable devices.

Transmit path 201 may include a digital-to-analog converter (DAC) 204. DAC 204 may be configured to receive a digital signal from digital circuitry 202 and convert such digital signal into an analog signal. Such analog signal may then be passed to one or more other components of transmit path 201, including upconverter 208.

Upconverter 208 may be configured to frequency upconvert an analog signal received from DAC 204 to a wireless communication signal at a radio frequency based on an oscillator signal provided by oscillator 210. Oscillator 210 may be any suitable device, system, or apparatus configured to produce an analog waveform of a particular frequency for modulation or upconversion of an analog signal to a wireless communication signal, or for demodulation or downconversion of a wireless communication signal to an analog signal. In some embodiments, oscillator 210 may be a digitally-controlled crystal oscillator.

Transmit path 201 may include a variable-gain amplifier (VGA) 214 to amplify an upconverted signal for transmission, and a bandpass filter 216 configured to receive an amplified signal VGA 214 and pass signal components in the band of interest and remove out-of-band noise and undesired signals. The bandpass filtered signal may be received by power amplifier 220 where it is amplified for transmission via antenna 218. Antenna 218 may receive the amplified and transmit such signal (e.g., to one or more of a terminal 110, a base station 120, and/or a satellite 130).

Receive path 221 may include a bandpass filter 236 configured to receive a wireless communication signal (e.g., from a terminal 110, a base station 120, and/or a satellite 130) via antenna 218. Bandpass filter 236 may pass signal components in the band of interest and remove out-of-band noise and undesired signals. In addition, receive path 221 may include a low-noise amplifier (LNA) 224 to amplify a signal received from bandpass filter 236.

Receive path 221 may also include a downconverter 228. Downconverter 228 may be configured to frequency downconvert a wireless communication signal received via antenna 218 and amplified by LNA 234 by an oscillator signal provided by oscillator 210 (e.g., downconvert to a baseband signal). In addition, downconverter 228 may be configured to output a current-mode analog signal as the downconverted signal.

Receive path 221 may further include an analog-to-digital converter (ADC) 224 configured to receive the current-mode analog signal from downconverter 228 and convert such analog signal into a digital signal. Such digital signal may then be passed to digital circuitry 202 for processing. ADC 224 is discussed in greater detail below with respect to FIGS. 3 and 4.

Figure 3:
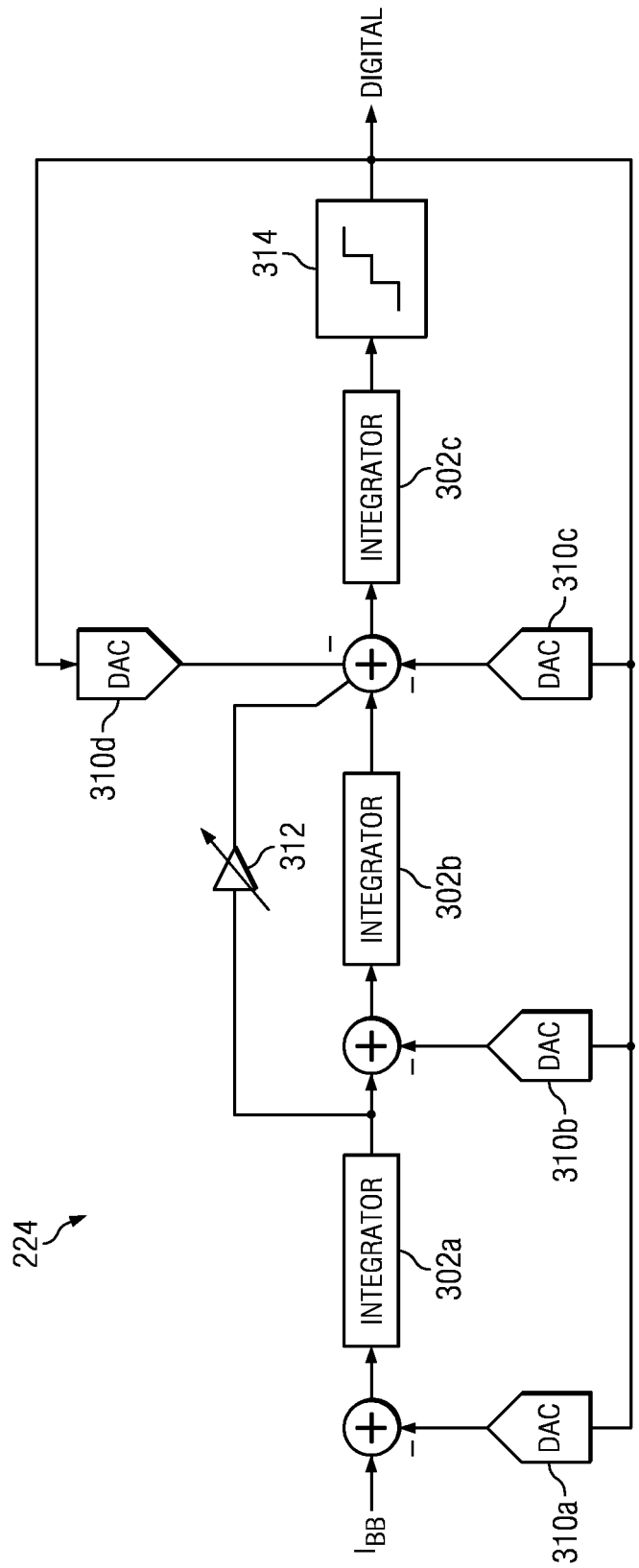
FIG. 3 illustrates a block diagram of an example analog-to-digital converter, in accordance with certain embodiments of the present disclosure.

FIG. 3 illustrates a block diagram of an example analog-to-digital converter 224, in accordance with certain embodiments of the present disclosure. As shown in FIG. 3, ADC 224 may include one or more integrators 302, one or more digital-to-analog converters 310, a gain element 312 and a quantizer 314.

An integrator 302 may be any system, device, or apparatus configured to integrate, with respect to time, a signal received at its input. In certain embodiments, an integrator 302 may have a current-mode output. As shown in FIG. 3, integrators 302 may be arranged in a cascade configuration, such that the output signal from some of integrators 302 may be communicated to a subsequent integrator 302 in the cascade configuration. In FIG. 3, ADC 224 includes three integrators 302, meaning that the embodiment of FIG. 3 is implemented as a third-order delta-sigma modulator. It is understood that ADC 224 may be implemented in any suitable nth-order delta-sigma modulator (in which n is any suitable positive integer number), and thus include any suitable number of integrators 302.

Quantizer 314 may be any system, device, or apparatus configured to receive an analog signal (e.g., an analog voltage signal in the embodiment depicted in FIG. 3) and convert such analog signal to an x-bit digital signal (in which x is any suitable positive integer number). Such digital signal may be output by ADC 224 to digital circuitry 202.

The output signal of quantizer 314 may also be fed back to the inputs of one or more of the integrators 302. For example, as shown in FIG. 3, the digital output signal of quantizer 314 may be communicated to one or more DACs 310. A DAC 310 may be configured to receive the digital signal from quantizer 314 and convert such digital signal into an analog current signal. A DAC 310 may also be configured to communicate such current signal to an input of an integrator 302, such that the DAC 310 output current signal is summed with other current signals communicated to the input of the integrator 302. To illustrate, the output current signal of DAC 310a may be summed with $I_{BB}$, the input current to ADC 224, and input to integrator 302a. Similarly, the output current signal of DAC 310b may be summed with the current output of integrator 302a and input to integrator 302b. Also, the output current signals of DAC 310c and 310d may be summed together and with the current output of integrator 302b and input to integrator 302c.

In some embodiments, DACs 310 providing feedback to the last integrator 302 stage of an ADC 224 may be configured to provide for delay compensation for delays introduced by quantizer 314 or other components of ADC 224. Accordingly, in such embodiments, such DACs 310 (e.g., DACs 310c and 310d of FIG. 3) may delay their output by a certain duration from its input. In these and other embodiments, the individual delays of such DACs 310 may be different. In addition, in certain embodiments (e.g., those in which delay compensation is not a concern), only one DAC 310 will provide feedback to the last integrator 302 stage. The presence of feedback to the inputs of integrators 302 may produce a filtering effect on the input current signal to ADC 224.

In operation, a current-mode baseband signal from downconverter 228 may be applied to the input of ADC 224 without any intervening filtering elements between downcoverter 228 and ADC 224. Such baseband signal is summed with a current-mode feedback signal from DAC 310a and input to integrator 302a. Any current-to-voltage conversion make takes place only at the output of the integrators 302 (as seen in the example circuit-level diagram depicted in FIG. 4, below). Advantageously, the input signal is transformed into a voltage only once it has been integrated by integrator 302, at which point any undesired out-of-band signal (or "blocker") may have been greatly attenuated. As long as downconverter 228 and integrator 302a are biased with enough current to process the current signal, no signal clipping may occur (as may occur with voltage-mode input ADCs where maximum signal amplitude is set by a supply voltage). Additional feedback using additional integrators 302 may provide further filtering the ADC 224 input signal, thus further reducing the presence of undesired out-of-band signals. Thus ADC 224 may be able to tolerate a large out-of-band signal without being pushed into saturation, and without the need for a separate filtering device interfaced between downconverter 228 and ADC 224.

In some embodiments of ADC 224, ADC 224 may include a feedforward path. Based on the gain of a gain element 312 of such feedforward path, the signal transfer function (STF) of ADC 224 may include a transmission zero at a particular frequency (e.g., at a frequency of a blocker). In such embodiments, the transmission zero may be set at a frequency corresponding to an undesired out-of-band signal. In certain embodiments, gain of gain element 312 (and thus the gain of the feedforward path) may be variable, allowing for tuning of the frequency at which the transmission zero will occur.

Of additional note, the design of ADC 224 may eliminate the need for an amplification stage between downconverter 228 and ADC 224. As a result, any DC offset generated by radio-frequency components prior to downcoverter 228 is not amplified and becomes negligible. As a result, ADC 224 itself may become the primary source of DC offset. Such DC offset may be minimized using suitable techniques. Advantageously, ADC 224 may eliminate the need for a DC offset correction loop, leading to less complexity, less cost, less power consumption and/or reduced calibration time.

Figure 4:
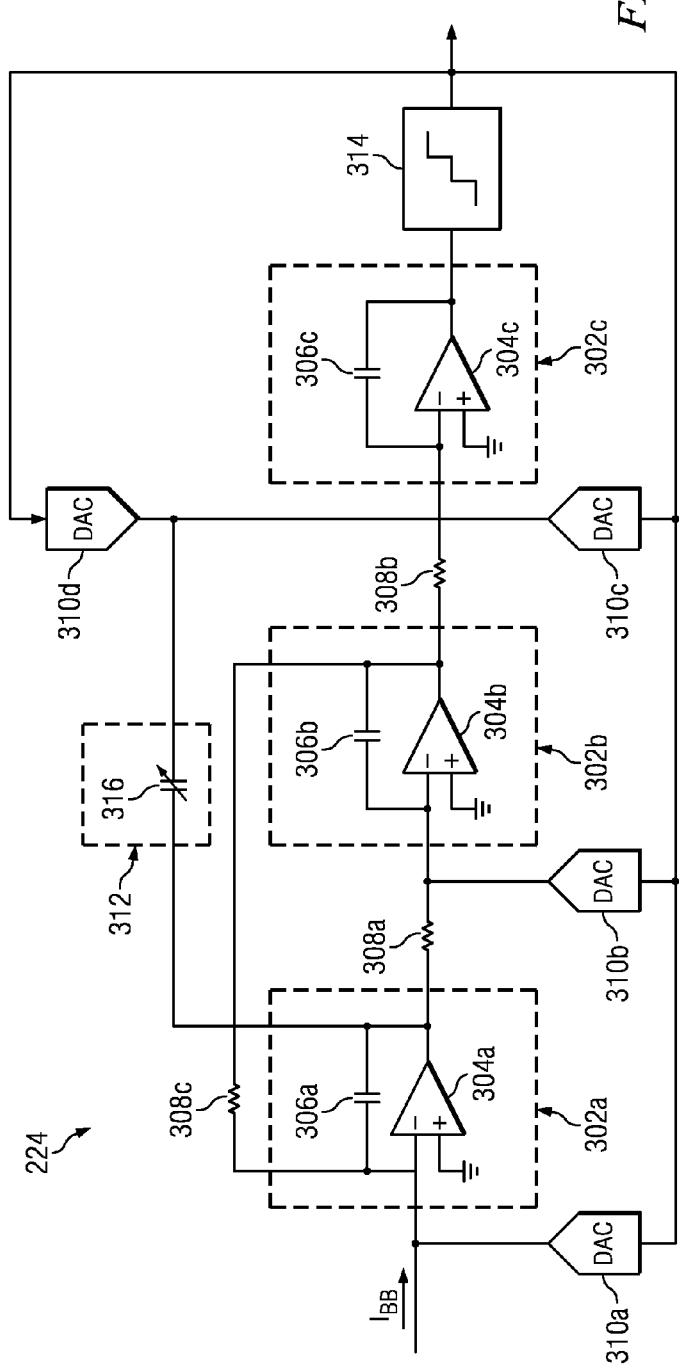
FIG. 4 illustrates an example circuit-level diagram of a example analog-to-digital converter, in accordance with certain embodiments of the present disclosure.
Figure 5:
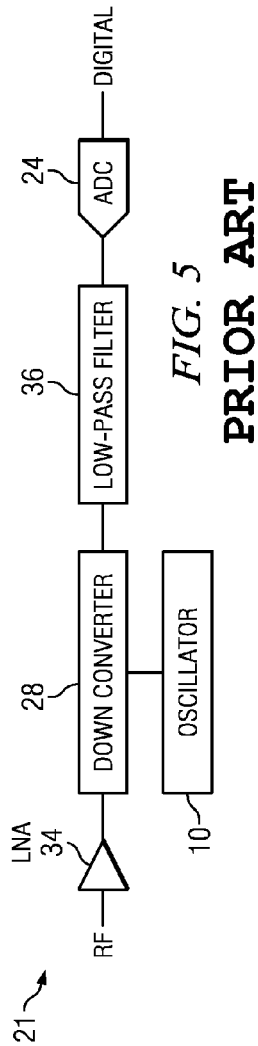
FIG. 5 illustrates selected components of a traditional receiver, as is known in the art.

FIG. 4 illustrates an example circuit-level diagram of certain embodiments of ADC 224, in accordance with certain embodiments of the present disclosure. As shown in FIG. 4, an integrator 302 may comprise an op amp integrator, including an operational amplifier 304 and a capacitor 306. An operational amplifier 304 may be any system, device, or apparatus with a differential input and either a single-ended or differential output (a single-ended output is depicted in FIG. 4), which is a multiple of the voltage difference between the input terminals. A capacitor 306 may be an electronic component consisting of a pair of conductors separated by a dielectric, such that when there a potential difference exists across the conductors a static electric field develops in the dielectric that stores energy and produces a mechanical force between the conductors.

The positive input terminal of an operational amplifier 302 may be coupled to a ground voltage. A capacitor 306 may be coupled between the negative input terminal and the output terminal of an operational amplifier 304. In operation, an integrator 302 may receive a current signal at its input (e.g., the negative input terminal of operational amplifier 304) and produce at its output a voltage signal representative of the integral of the input current signal with respect to time.

As shown in FIG. 4, certain of integrators 302 may be coupled via resistors 308. A resistor 308 may be any electronic component that produces a voltage across its terminals that is proportional to the electric current passing through it in accordance with Ohm's law. In operation of ADC 224, some resistors 308 (e.g., resistors 308a and 308b) may convert a voltage output by one integrator 302 to a current to be input to another integrator 302. In addition, some resistors 308 may be configured to affect a transfer function of ADC 224. For example, a resistor 308c may be coupled in a feedback path between the output of integrator 302b and the input of integrator 302a in order to establish a desired noise transfer function (NTF) of ADC 224. Properties of components of ADC 224, including the resistance of resistor 308c, resistors 308a, and/or capacitors 306b, may be selected such that the NTF has a small out-of-band gain, compared to traditional approaches in which a large out-of-band gain for the NTF is used.

As shown in FIG. 4, gain element 312 of a feedforward path of ADC 224 may be implemented as a programmable capacitor 316 interfaced between the output of the first stage integrator 302a and final stage integrator 302c, such that a signal produced by the feedforward path may sum with other current signals communicated to the input of integrator 302c. Although FIG. 4 depicts a particular configuration for the feedforward path, other configurations are possible (e.g., programmable capacitor may be coupled between the output of any integrator 302 and the input of any later-stage integrator 302).

Modifications, additions, or omissions may be made to system 100 from the scope of the disclosure. The components of system 100 may be integrated or separated. Moreover, the operations of system 100 may be performed by more, fewer, or other components. As used in this document, "each" refers to each member of a set or each member of a subset of a set.

Although the present disclosure has been described with several embodiments, various changes and modifications may be suggested to one skilled in the art. It is intended that the present disclosure encompass such changes and modifications as fall within the scope of the appended claims.

What is claimed is:

1. A receiver, comprising:
    a downconverter configured to demodulate a modulated wireless signal to produce a current-mode baseband signal; and
    an analog-to-digital converter (ADC) configured to convert the current-mode baseband signal into a digital output signal, the ADC having a signal transfer function with a transmission zero at a desired frequency;
    the ADC comprising:
        a plurality of integrators, each integrator configured to convert a sum of current-mode signals received at its input to a voltage-mode signal indicative of an integral over time of the sum of current-mode signals, the plurality of integrators comprising at least:
            a first-stage integrator configured to receive at its input the current-mode baseband signal; and
            a final-stage integrator configured to produce at its output a final-stage analog signal;
            wherein the plurality of integrators are arranged in a cascade configuration such that an output of each of the plurality of integrators other than the final-stage integrator is coupled to the input of a subsequent integrator via a resistor such that the resistor carries a first current-mode signal to the input of the subsequent integrator;
        a quantizer configured to convert the final-stage analog signal to the digital output signal;
        a plurality of digital-to-analog converters (DACs), each particular DAC associated with one of the plurality of integrators and configured to convert the digital output signal into a second current-mode signal such that the second current-mode signal is carried to the input of the integrator associated with the particular DAC;
        a feedforward path from the output of a first integrator of the plurality of integrators to the input of a second integrator of the plurality of integrators, the feedforward path comprising a capacitor have a capacitance selected to provide the transmission zero in the signal transfer function of the ADC at the desired frequency; and
        a delay compensation DAC configured to convert the digital output signal into a third current-mode signal such that the third current-mode signal is carried to the input of the final-stage integrator.

2. A receiver according to claim 1, wherein the downconverter is coupled to the ADC without an intervening filter element.

3. A receiver according to claim 1, wherein the delay compensation DAC has a time delay different than that of the particular DAC associated with the final-stage integrator.

4. A receiver according to claim 1, the ADC further comprising a feedback path from the output of one of the plurality of integrators other than the final-stage integrator to the input of the first-stage integrator.

5. A receiver according to claim 4, the feedback path comprising a second resistor.

6. A receiver comprising:
    a downconverter configured to demodulate a modulated wireless signal to produce a current-mode baseband signal; and
    an analog-to-digital converter (ADC) configured to convert the current-mode baseband signal into a digital output signal, the ADC having a signal transfer function with a transmission zero at a desired frequency;
    wherein the ADC comprises:
        a plurality of integrators, each integrator configured to convert a sum of current-mode signals received at its input to a voltage-mode signal indicative of an integral over time of the sum of current-mode signals, the plurality of integrators comprising at least:
            a first-stage integrator configured to receive at its input the current-mode baseband signal; and
            a final-stage integrator configured to produce at its output a final-stage analog signal;
            wherein the plurality of integrators are arranged in a cascade configuration such that an output of each of the plurality of integrators other than the final-stage integrator is coupled to the input of a subsequent integrator via a resistor such that the resistor carries a first current-mode signal to the input of the subsequent integrator;
        a quantizer configured to convert the final-stage analog signal to the digital output signal;
        a plurality of digital-to-analog converters (DACs), each particular DAC associated with one of the plurality of integrators and configured to convert the digital output signal into a second current-mode signal such that the second current-mode signal is carried to the input of the integrator associated with the particular DAC; and
        a feedforward path from the output of a first integrator of the plurality of integrators to the input of a second integrator of the plurality of integrators, the feedforward path comprising a capacitor have a capacitance selected to provide the transmission zero in the signal transfer function of the ADC at the desired frequency.

7. A receiver according to claim 6, the first integrator comprising the first-stage integrator and the second integrator comprising the final-stage integrator.

8. A receiver according to claim 6, the capacitor comprising a tunable capacitance.

9. An analog-to-digital converter (ADC) configured to convert a current-mode baseband signal into a digital output signal, the ADC comprising:
    a plurality of integrators, each integrator configured to convert a sum of current-mode signals received at its input to a voltage-mode signal indicative of an integral over time of the sum of current-mode signals, the plurality of integrators comprising at least:
        a first-stage integrator configured to receive at its input the current-mode baseband signal; and
        a final-stage integrator configured to produce at its output a final-stage analog signal;
        wherein the plurality of integrators are arranged in a cascade configuration such that an output of each of the plurality of integrators other than the final-stage integrator is coupled to the input of a subsequent integrator via a resistor such that the resistor carries a first current-mode signal to the input of the subsequent integrator;
    a quantizer configured to convert the final-stage analog signal to the digital output signal;

a plurality of digital-to-analog converters (DACs), each particular DAC associated with one of the plurality of integrators and configured to convert the digital output signal into a second current-mode signal such that the second current-mode signal is carried to the input of the integrator associated with the particular DAC;

a feedforward path from the output of a first integrator of the plurality of integrators to the input of a second integrator of the plurality of integrators, the feedforward path comprising a capacitor have a capacitance selected to provide a transmission zero in a signal transfer function of the ADC at a desired frequency; and a delay compensation DAC configured to convert the digital output signal into a third current-mode signal such that the third current-mode signal is carried to the input of the final-stage integrator.

10. An ADC according to claim 9, wherein the delay compensation DAC has a time delay different than that of the particular DAC associated with the final-stage integrator.

11. An ADC according to claim 9, the ADC further comprising a feedback path from the output of one of the plurality of integrators other than the final-stage integrator to the input of the first-stage integrator.

12. An ADC according to claim 11, the feedback path comprising a second resistor.

13. An analog-to-digital converter (ADC) configured to convert a current-mode baseband signal into a digital output signal, the ADC comprising:

a plurality of integrators, each integrator configured to convert a sum of current-mode signals received at its input to a voltage-mode signal indicative of an integral over time of the sum of current-mode signals, the plurality of integrators comprising at least:
a first-stage integrator configured to receive at its input the current-mode baseband signal; and
a final-stage integrator configured to produce at its output a final-stage analog signal;
wherein the plurality of integrators are arranged in a cascade configuration such that an output of each of the plurality of integrators other than the final-stage integrator is coupled to the input of a subsequent integrator via a resistor such that the resistor carries a first current-mode signal to the input of the subsequent integrator;

a quantizer configured to convert the final-stage analog signal to the digital output signal;

a plurality of digital-to-analog converters (DACs), each particular DAC associated with one of the plurality of integrators and configured to convert the digital output signal into a second current-mode signal such that the second current-mode signal is carried to the input of the integrator associated with the particular DAC; and a feedforward path from the output of a first integrator of the plurality of integrators to the input of a second integrator of the plurality of integrators, the feedforward path comprising a capacitor have a capacitance selected to provide a transmission zero in a signal transfer function of the ADC at a desired frequency.

14. An ADC according to claim 13, the first integrator comprising the first-stage integrator and the second integrator comprising the final-stage integrator.

15. An ADC according to claim 13, the capacitor comprising a tunable capacitance.

16. An ADC according to claim 13, further comprising a delay compensation DAC configured to convert the digital output signal into a third current-mode signal such that the third current-mode signal is carried to the input of the final-stage integrator, wherein the delay compensation DAC has a time delay different than that of the particular DAC associated with the final-stage integrator.

17. An ADC according to claim 13, the ADC further comprising a feedback path from the output of one of the plurality of integrators other than the final-stage integrator to the input of the first-stage integrator.

18. An ADC according to claim 17, the feedback path comprising a second resistor.

19. A wireless communication element, comprising:
a transmit path configured to convert a first digital signal into a first modulated wireless communication signal and transmit the first modulated wireless communication signal; and
a receive path configured to receive a second modulated wireless communication signal and convert the second modulated wireless communication signal into a second digital signal, the receive path comprising:
a downconverter configured to demodulate the second modulated wireless communication signal to produce a current-mode baseband signal; and
an analog-to-digital converter (ADC) configured to convert the current-mode baseband signal into the second digital signal, the ADC having a signal transfer function with a transmission zero at a desired frequency;
the ADC comprising:
a plurality of integrators, each integrator configured to convert a sum of current-mode signals received at its input to a voltage-mode signal indicative of an integral over time of the sum of current-mode signals, the plurality of integrators comprising at least:
a first-stage integrator configured to receive at its input the current-mode baseband signal; and
a final-stage integrator configured to produce at its output a final-stage analog signal;
wherein the plurality of integrators are arranged in a cascade configuration such that an output of each of the plurality of integrators other than the final-stage integrator is coupled to the input of a subsequent integrator via a resistor such that the resistor carries a first current-mode signal to the input of the subsequent integrator;
a quantizer configured to convert the final-stage analog signal to the second digital signal;
a plurality of digital-to-analog converters (DACs), each particular DAC associated with one of the plurality of integrators and configured to convert the second digital signal into a second current-mode signal such that the second current-mode signal is carried to the input of the integrator associated with the particular DAC; and
a feedforward path from the output of a first integrator of the plurality of integrators to the input of a second integrator of the plurality of integrators, the feedforward path including a gain element, wherein the frequency of the transmission zero depends on the gain element, the gain element comprising a capacitor have a capacitance selected to provide the transmission zero in the signal transfer function of the ADC at the desired frequency.

20. A wireless communication element according to claim 19, wherein the downconverter is coupled to the ADC without an intervening filter element.

21. A wireless communication element according to claim 19, wherein:
the capacitor comprises a variable capacitor; and
the frequency of the transmission zero depends on the variable capacitor.

* * * * *